(12) United States Patent
Kimura et al.

(10) Patent No.: US 8,685,615 B2
(45) Date of Patent: Apr. 1, 2014

(54) PHOTOSENSITIVE RESIST UNDERLAYER FILM FORMING COMPOSITION

(75) Inventors: Shigeo Kimura, Toyama (JP); Hirokazu Nishimaki, Toyama (JP); Tomoya Ohashi, Toyama (JP); Yuki Usui, Toyama (JP); Takahiro Kishioka, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 477 days.

(21) Appl. No.: 12/817,648

(22) Filed: Jun. 17, 2010

(65) Prior Publication Data

US 2011/0311915 A1    Dec. 22, 2011

(51) Int. Cl.
  *G03F 7/004*   (2006.01)
  *G03F 7/09*    (2006.01)
  *G03F 7/26*    (2006.01)

(52) U.S. Cl.
  USPC .............. 430/270.1; 430/271.1; 430/312; 430/322

(58) Field of Classification Search
  USPC ........... 430/270.1, 271.1, 322, 312, 327, 927
  See application file for complete search history.

(56) References Cited

U.S. PATENT DOCUMENTS

| | | | | |
|---|---|---|---|---|
| 6,106,995 | A * | 8/2000 | Dixit et al. | 430/270.1 |
| 6,132,928 | A * | 10/2000 | Tanabe et al. | 430/270.1 |
| 6,156,479 | A | 12/2000 | Meador et al. | |
| 6,416,930 | B2 * | 7/2002 | Wakiya et al. | 430/273.1 |
| 7,736,822 | B2 * | 6/2010 | Hashimoto et al. | 430/5 |
| 2008/0090184 | A1* | 4/2008 | Sui et al. | 430/327 |
| 2010/0239984 | A1* | 9/2010 | Tsubaki | 430/325 |

FOREIGN PATENT DOCUMENTS

| | | |
|---|---|---|
| JP | A-2004-054286 | 2/2004 |
| JP | A-2005-043883 | 2/2005 |
| JP | A-2005-070154 | 3/2005 |
| WO | WO 2005/093513 A2 | 10/2005 |
| WO | WO 2005/111719 A2 | 11/2005 |
| WO | WO 2005/111724 A1 | 11/2005 |
| WO | WO 2008/140119 * | 11/2008 |

OTHER PUBLICATIONS

Sigma-Aldrich Pentadecafluorooctanoic Acid, 2013.*

* cited by examiner

*Primary Examiner* — Anca Eoff
(74) *Attorney, Agent, or Firm* — Oliff PLC

(57) ABSTRACT

A resist underlayer film forming composition used in a lithography process includes: a polymer (A) containing a unit structure having a hydroxy group, a unit structure having a carboxy group, or combination thereof; a crosslinkable compound (B) having at least two vinyl ether groups; a photoacid generator (C); a $C_{4-20}$ fluoroalkylcarboxylic acid or a salt of the fluoroalkylcarboxylic acid (D); and a solvent (E). The polymer (A) includes a unit structure selected from unit structures of Formula (1), Formula (2), and Formula (3);

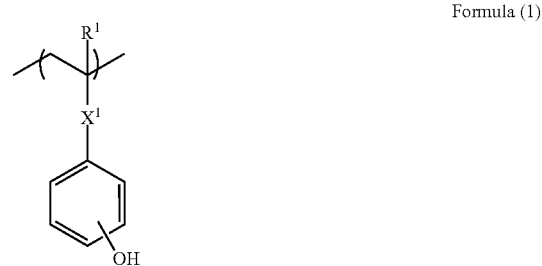

Formula (1)

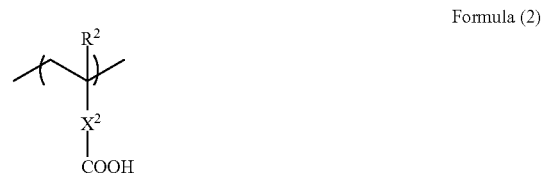

Formula (2)

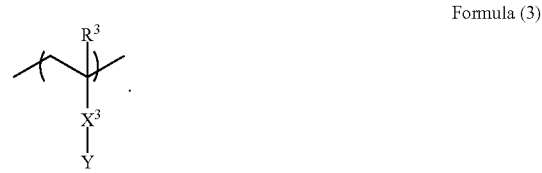

Formula (3)

12 Claims, 1 Drawing Sheet

PHOTOSENSITIVE RESIST UNDERLAYER FILM FORMING COMPOSITION

BACKGROUND OF THE INVENTION

1. Field of the Invention

The present invention relates to a resist underlayer film used in a lithography process during the production of a semiconductor device and to a forming method of a resist pattern using the resist underlayer film.

2. Description of the Related Art

In the production of a semiconductor device, fine processing by lithography using a photoresist is performed. The fine processing is a processing method for forming fine convexoconcave corresponding to a pattern on the surface of a substrate by: forming a thin film of a photoresist on a semiconductor substrate such as a silicon wafer; irradiating the resultant thin film with an activating light ray such as an ultra violet ray through a mask pattern in which a pattern of a device is depicted; developing the film; and subjecting the substrate to etching processing using the resultant photoresist pattern as a protection film. Recently, higher integration of devices has been pursued, and there is a tendency that exposure lights having shorter wavelengths such as a KrF excimer laser (having a wavelength of 248 nm) and an ArF exciter laser (having a wavelength of 193 nm) are adopted. However, these photolithography processes can cause a problem of lowering the dimensional accuracy of a photoresist pattern due to the influence of a standing wave caused by the reflection of exposure light on the substrate or the influence of the diffuse reflection of exposure light caused by unevenness of the substrate. In order to solve this problem, a method of providing a bottom anti-reflective coating between the photoresist and the substrate has been widely studied.

Such a bottom anti-reflective coating is formed typically by using a thermal crosslinkable composition in order to prevent intermixing between the bottom anti-reflective coating and a photoresist coated thereon. As a result, the formed bottom anti-reflective coating is insoluble in an alkaline developer used for developing a photoresist. Therefore, the removal of the bottom anti-reflective coating needs to be performed by dry etching prior to the processing of the semiconductor substrate (for example, see U.S. Pat. No. 6,156,479).

However, the photoresist is also dry etched in the removal process of the bottom anti-reflective coating by dry etching, which makes it difficult to keep the film thickness of the photoresist large enough for the processing of the substrate. This becomes a critical problem especially when a thin film photoresist is used to enhance the resolution.

In addition, as the ion implantation process in the production of semiconductor devices, a process for introducing impurity ions imparting a n- or p-conductivity type into a semiconductor substrate using a photoresist pattern as a mask may be adopted. In this process, to prevent the surface of a substrate from being damaged, it is not desired to perform dry etching in the formation of a photoresist pattern. Therefore, in the formation of a photoresist pattern for an ion implantation process, a bottom anti-reflective coating requiring the removal by dry etching cannot be used as an underlayer of the photoresist. A photoresist pattern used as a mask in an ion implantation process has had a relatively large line width and, therefore, been rarely influenced by a standing wave caused by the reflection of exposure light on a substrate or by the diffuse reflection of exposure light due to unevenness of a substrate. Therefore, problems of reflection have been solved by using a photoresist containing a dye or using a top anti-reflective coating on the photoresist. However, as the miniaturization has been advanced in recent years, fine patterns are required also for photoresists used in ion implantation processes, and providing a bottom anti-reflective coating (resist underlayer film) below the photoresist is required.

Under such circumstances, it has been desired to develop a bottom anti-reflective coating that can be dissolved in an alkaline developer used in the development of a photoresist and can be removed in the development process together with the photoresist. Such bottom anti-reflective coatings that can be removed in the development process together with the photoresist have been studied (for example, see Japanese Patent Application Publication No. JP-A-2004-54286, Japanese Patent Application Publication No. JP-A-2005-70154, International Publication No. WO 05/093513 pamphlet, International Publication No. WO 05/111719 pamphlet, International Publication No. WO 05/111724 pamphlet).

A bottom anti-reflective coating that can be removed in the development process together with a photoresist is exposed to a solvent when the photoresist is applied on the bottom anti-reflective coating. Through the exposure to a solvent, the solvent penetrates into the bottom anti-reflective coating, and thither, a photoacid generator component in the bottom anti-reflective coating is eluted. Therefore, in terms of the applicability to fine processing and the shape of a pattern to be formed, such bottom anti-reflective coating is not satisfactory.

Also disclosed is a photosensitive resin composition containing fluoroalkylcarboxylic acid sulfonium (see Japanese Patent Application Publication No. JP-A-2005-43883).

SUMMARY OF THE INVENTION

It is an object of the present invention to provide a resist underlayer film forming composition for forming a resist underlayer film having a strong absorption of short-wavelength light such as an ArF excimer laser (having a wavelength of 193 nm) and a KrF excimer laser (having a wavelength of 248 nm). It is another object of the present invention to provide a resist underlayer film forming composition for forming a resist underlayer film that effectively absorbs reflected light on a semiconductor substrate and causes no intermixing with a photoresist film, when irradiation light of an MT excimer laser and a KrF excimer laser is used in fine processing of a lithography process. It is yet another object of the present invention to provide: a resist underlayer film forming composition for forming a resist underlayer film by which a focus depth margin having a large width can be obtained; and a resist underlayer film forming composition for forming a resist underlayer film that can be alkali-developed simultaneously with a photoresist film when the photoresist film is alkali-developed. The focus depth margin is a range, within which a focus position is displaced upwards or downwards from an optimal exposure position but a pattern, can be formed, and it is preferred for the process that the focus depth margin has a large width. It is yet another object of the present invention to provide a forming method of a photoresist pattern using the resist underlayer film forming composition.

The present invention provides, according to a first aspect, a resist underlayer film forming composition used in a lithography process including a polymer (A) containing a unit structure having a hydroxy group, a unit structure having a, carboxy group, or combination thereof, a crosslinkable compound (B) having at least two vinyl ether groups, a photoacid generator (C), a $C_{4-20}$ fluoroalkylcarboxylic acid or a salt of the fluoroalkylcarboxylic acid (D), and a solvent (E), according to a second aspect, the resist underlayer film forming composition according to the first aspect, in which the polymer (A) includes a unit structure selected from unit structures of Formula (1), Formula (2), and Formula (3):

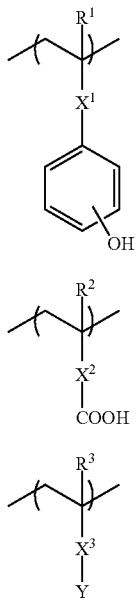

(where $R^1$, $R^2$, and $R^3$ are individually a hydrogen atom or a methyl group; $X^1$, $X^2$, and $X^3$ are individually a direct bond or a linking group; and Y is a light absorbing group), where when the total number of all unit structures constituting the polymer is assumed to be 1.0, the number a of unit structures of Formula (1), the number b of unit structures of Formula (2), and the number c of unit structures of Formula (3) satisfy equations: $0 \leq a \leq 1.0$, $0 \leq b \leq 1.0$, $0 \leq c \leq 0.5$, and $0.5 \leq a+b \leq 1.0$; and has a weight average molecular weight of 3,000 to 100,000, according to a third aspect, the resist underlayer film forming composition according to the second aspect, in which $X^1$ is a direct bond or —C(=O)NR$^4$— (where $R^4$ is a hydrogen atom or an alkyl group), $X^2$ is a direct bond or a phenyl group, and $X^3$ is a direct bond or an organic group having an ester group, an ether group, are alkyl group, or a combination thereof, according to a fourth aspect, the resist underlayer film forming composition according to any one of the first aspect to the third aspect, in which the crosslinkable compound (B) is a crosslinkable compound of Formula (4) or Formula (5):

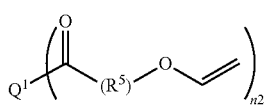

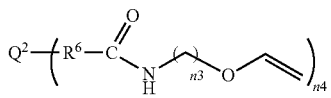

(where $Q^1$ is a (n2)-valent $C_{1-10}$alkyl group, a (n2)-valent $C_{6-30}$ aryl group, or a (n2)-valent heterocycle group; $Q^2$ is a (n4)-valent $C_{1-10}$ alkyl group, a (n4)-valent $C_{6-30}$ aryl group, or a (n4)-valent heterocycle group; $R^5$ is a —O(CH$_2$)$_{n1}$— group or a —(OCH$_2$)$_{n1}$— group; $R^6$ is a direct bond, an alkylene group, or an arylene group; (n1) and (n3) are individually an integer of 1 to 10; and (n2) and (n4) are individually an integer of 2 to 4), according to a fifth aspect, the resist underlayer film forming composition according to any one of the first aspect to the fourth aspect, in which the $C_{4-20}$ fluoroalkylcarboxylic acid or a salt of the fluoroalkylcarboxytic acid (D) is a compound of Formula (6);

$$R^7—COO^-Z^+ \qquad \text{Formula (6)}$$

(where $R^7$ is a $C_{4-20}$ fluoroalkyl group or a $C_{4-20}$ perfluoroalkyl group; and $Z^+$ is a proton, sulfonium, iodonium, ammonium, phosphonium, or stibonium), according to a sixth aspect, the resist underlayer film forming composition according to any one of the first aspect to the fifth aspect, further containing a basic compound (F), and according to a seventh aspect, a forming method of a photoresist pattern used in the production of a semiconductor device, the forming method including: applying the resist underlayer film forming composition described in any one of the first aspect to the sixth aspect on a semiconductor substrate and baking the composition to form a resist underlayer film; forming a photoresist film on the resist underlayer film; exposing the semiconductor substrate coated with the resist underlayer film and the photoresist film to light; and developing the photoresist film and the resist underlayer film after the exposure.

By applying and heat-drying the resist underlayer film forming composition of the present invention, a resist underlayer film is formed. The polymer (A) containing a unit structure having a hydroxy group, a unit structure having a carboxy group, or combination, thereof, and the crosslinkable compound (B) having at least two vinyl ether groups in the resist underlayer film together form an acetal bond to form a crosslinkage, whereby the resist underlayer film exhibits resistance to intermixing with m upper coating resist and resistance to an alkaline developer. When the resist underlayer film together with the resist is exposed to light through a mask, an acid is generated by a photoacid generator in the resist underlayer film and the generated acid breaks the acetal bond to form an alkali-soluble group such as a hydroxy group, a carboxy group, or combination thereof. Accordingly, an exposed portion is removed together with the resist by an alkaline developer to form a pattern.

In the present invention, a long-chain fluoroalkylcarboxylic acid or a salt of the fluoroalkylcarboxylic acid as the (D) component is contained. This compound is considered to easily move to the upper layer portion of the resist underlayer film when a solvent still remains in the applied resist underlayer film forming composition due to the influence of surface energy by a fluorinated alkyl group. The resist underlayer film is overcoated with a resist, and therefore, the upper layer portion of the resist underlayer film is an interface that is in contact with the resist.

In the upper layer portion of the resist underlayer film formed after the solvent is evaporated, a long-chain fluoroalkylcarboxylic acid or a salt of the fluoroalkylcarboxylic acid exists. This compound has a buffer due to a carboxylic acid ion of the compound. This compound has acidity weaker than that of a photoacid generator (C) inhering in the resist underlayer film.

Part of the acid generated by the photoacid generator in the resist film during the exposure is considered to move also into the resist underlayer film. Meanwhile, a photoacid generator also exists in the resist underlayer film, and at the interface, a large amount of acids is easily formed. Such excessive acid moves to an unexposed portion and the unexposed portion exhibits alkali solubility, and the pattern is deformed as a result. To prevent such pattern deformation, a basic compound assuming a role of trapping excessive acid such as amines can be mixed in the composition. By mixing a long-chain fluoroalkylcarboxylic acid or a salt of the fluoroalkylcarboxylic acid as the (D) component in the composition in the present invention, the resist underlayer film has a buffer and pH of the resist underlayer film does not largely vary in spite of excessive acid, Therefore, the unexposed portion does not exhibit alkali solubility and thus it is considered that the resist shape becomes a rectangular shape. In addition, a weak carboxylic acid derived from a long-chain fluoroalkylcarboxylic acid or a salt of the fluoroalkylcarboxylic acid existing in the resist underlayer film interacts strongly with a strong acid generated by a photoacid generator and shortens a diffusion length of the strong acid. Consequently, the transition of the excessive acid into the unexposed portion is suppressed and the resist shape is considered to be a rectangular shape.

DETAILED DESCRIPTION OF THE EMBODIMENTS

Figure 1:
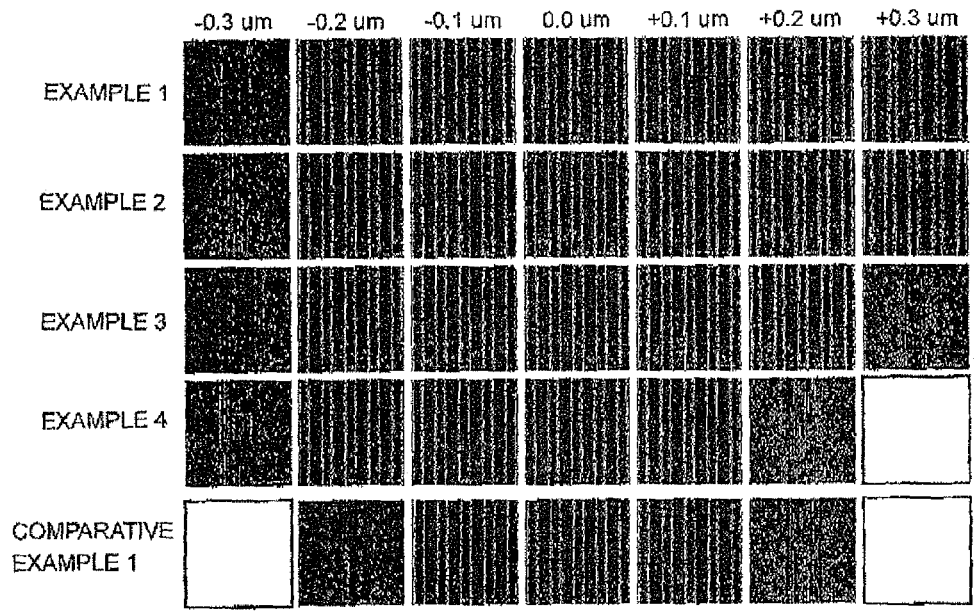
FIG. 1 is a scanning electron microscope photograph of a resist pattern shape for measuring a focus depth margin of the resist underlayer film obtained using each of the resist underlayer film forming compositions of Example 1 to Example 4 and Comparative Example 1 with a magnification of 80,000 times.

The present invention is a resist underlayer filth forming composition used in a lithography process containing: a polymer (A) containing a unit structure having a hydroxy group, a unit structure having a carboxy group, or combination thereof; a crosslinkable compound (B) having at least two vinyl ether groups; a photoacid generator (C); a $C_{4-20}$ fluoroalkylcarboxylic acid or a salt of the fluoroalkylcarboxylic acid (D); and a solvent (E). The resist underlayer film forming composition may further contain as optional components, a basic compound, an organic polymer, a surfactant, and the like.

The solid content in the resist underlayer film forming composition of the present invention is, for example 0.1 to 50% by mass, 0.2 to 30% by mass, or 0.5 to 25% by mass. Here, the solid content is a component remaining after subtracting a solvent component from all components of the resist underlayer film forming composition.

The content of the polymer (A) in the solid content is 20% by mass or more and may be, for example 50 to 99% by mass or 60 to 90% by mass.

The crosslinkable compound (B) having at least two vinyl ether groups may be mixed in the composition in an amount of 1 to 100 part(s) by mass, or 10 to 60 parts by mass, or 30 to 50 parts by mass, relative to 100 parts by mass of the polymer (A).

The photoacid generator (C) may be mixed in the composition in an amount of 0.0001 mol to 1 mol or 0.001 mol to 0.1 mol, relative to 100 parts by mass of the polymer (A).

The $C_{4-20}$ fluoroalkylcarboxylic acid or a salt of the fluoroalkylcarboxylic acid (D) may be mixed in the composition in an amount of 0.000025 mol to 10 mol or 0.00025 mol to 1 mol, relative to 100 parts by mass of the polymer (A).

In the resist underlayer film forming composition, the polymer (A) includes a unit structure selected from the unit structures of Formula (1), Formula (2), and Formula (3), where when the total number of all unit structures constituting the polymer is assumed to be 1.0, the number a of unit structures of Formula (1), the number b of unit structures of Formula (2), and the number c of unit structures of Formula (3) satisfy equations: $0 \le a \le 1.0$, $0 \le b \le 1.0$, $0 \le c \le 0.5$, and $0.5 \le a+b \le 1.0$; and has a weight average molecular weight of 3,000 to 100,000.

In the polymer (A), $R^1$, $R^2$, and $R^3$ are individually a hydrogen atom or a methyl group. $X^1$, $X^2$, and $X^3$ are individually a direct bond or a linking group. X is a light absorbing group, Then, $X^1$ is a direct bond or —C(=O)NR$^4$—, where $R^4$ is a hydrogen atom or an alkyl group. $X^2$ is a direct bond or a phenyl group. $X^3$ may be a direct bond or an organic group having an ester group, an ether group, an alkyl group, or a combination thereof.

Examples of the linking group include an ester group, an ether group, an alkyl group, an amide group, and a combination thereof.

Examples of the light absorbing group include a naphthyl group, an anthryl group, and derivatives thereof.

Examples of the alkyl group include $C_{1-10}$alkyl groups such as methyl, ethyl, n-propyl, i-propyl, cyclopropyl, n-butyl, i-butyl, s-butyl, t-butyl, cyclobutyl, 1-methyl-cyclopropyl, 2-methyl-cyclopropyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, cyclopentyl, 1-methyl-cyclobutyl, 2-methyl-cyclobutyl, 3-methyl-cyclobutyl, 1,2-dimethyl-cyclopropyl, 2,3-dimethyl-cyclopropyl, 1-ethyl-cyclopropyl, 2-ethyl-cyclopropyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, 1-ethyl-2-methyl-n-propyl, cyclohexyl, 1-methyl-cyclopentyl, 2-methyl-cyclopentyl, 3-methyl-cyclopentyl, 1-ethyl-cyclobutyl, 2-ethyl-cyclobutyl, 3-ethyl-cyclobutyl, 1,2-dimethyl-cyclobutyl, 1,3-dimethyl-cyclobutyl, 2,2-dimethyl-cyclobutyl, 2,3-dimethyl-cyclobutyl, 2,4-dimethyl-cyclobutyl, 3,3-dimethyl-cyclobutyl, 1-n-propyl-cyclopropyl, 2-n-propyl-cyclopropyl, 1-1-propyl-cyclopropyl, 2-1-propyl-cyclopropyl, 1,2,2-trimethyl-cyclopropyl, 1,2,3-trimethyl-cyclopropyl, 2,2,3-trimethyl-cyclopropyl, 1-ethyl-2-methyl-cyclopropyl, 2-ethyl-1-methyl-cyclopropyl, 2-ethyl-2-methyl-cyclopropyl, and 2-ethyl-3-methyl-cyclopropyl.

Examples of the unit structure of Formula (1) in the polymer (A) include unit structures of Formulae (1-1) to (1-5):

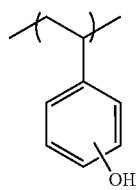

Formula (1-1)

Formula (1-2)
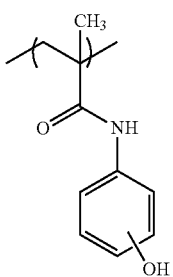
Formula (2-2)
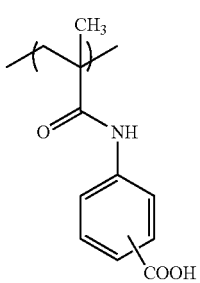
Formula (1-3)
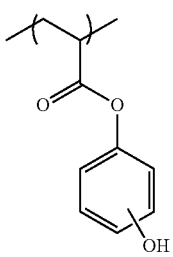
Formula (2-3)
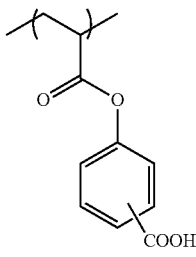
Formula (1-4)
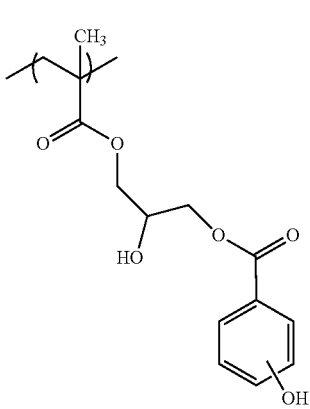
Formula (2-4)
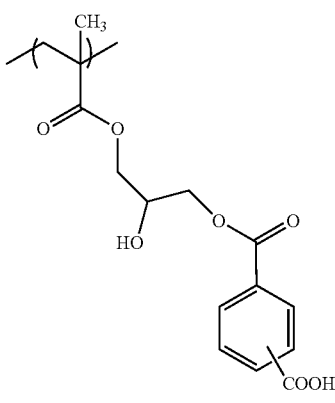
Formula (1-5)
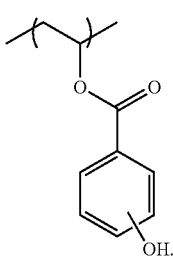
Formula (2-5)
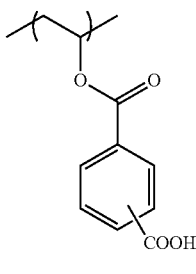
Formula (2-6)
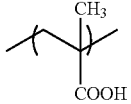
Examples of the unit structure of Formula (2) in the polymer (A) include unit structures of Formulae (2-1) to (2-6):
Examples of the unit structure of Formula (3) in the polymer (A) include unit structures of Formulae (3-1) to (3-6);
Formula (2-1)
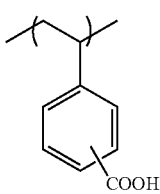
Formula (3-1)
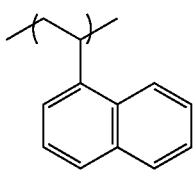

-continued

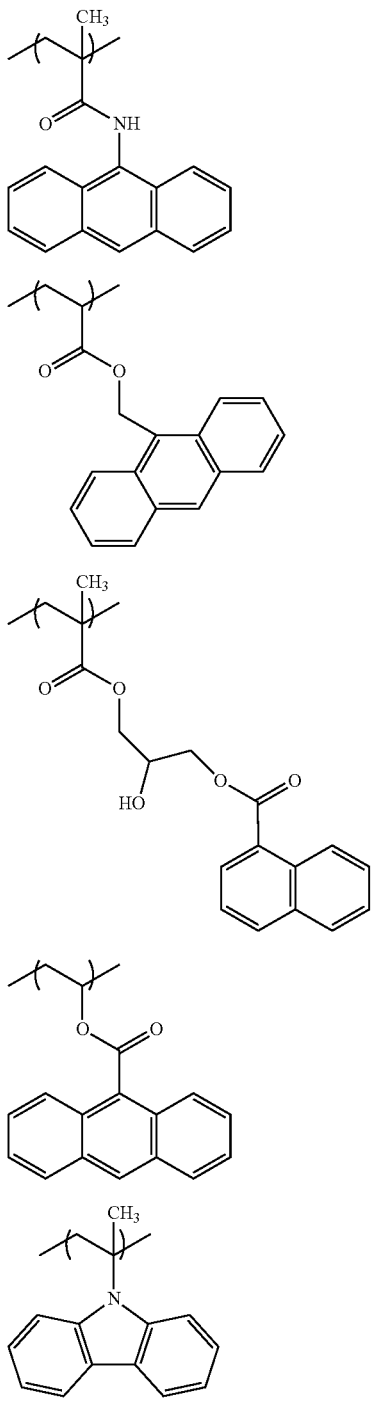

Formula (3-2)

Formula (3-3)

Formula (3-4)

Formula (3-5)

Formula (3-6)

The polymer (A) used in the present invention may contain besides the unit structures of Formula (1), Formula (2), and Formula (3), other unit structures. In this case, the content of the other unit structure may be 10% by mass or more, for example 10 to 50% by mass, based on the total mass of the alkali-soluble resin (A).

The other unit can be introduced into the polymer by using a polymerizable compound such as acrylic acid ester compounds, methacrylic acid ester compounds, maleimide compounds, acrylonitrile, maleic anhydride, styrene compounds, and vinyl compounds during the production of the polymer.

Examples of the acrylic acid ester compound include methyl acrylate, ethyl acrylate, isopropyl acrylate, benzyl acrylate, naphthyl acrylate, anthryl acrylate, anthrylmethyl acrylate, phenyl acrylate, 2-hydroxyethyl acrylate, 2-hydroxypropyl acrylate, 2,2,2-trifluoroethyl acrylate, tert-butyl acrylate, cyclohexyl acrylate, isobornyl acrylate, 2-methoxyethyl acrylate, methoxytriethyleneglycol acrylate, mono-(2-(acryloyloxy)ethyl) phthalate, 2-ethoxyethyl acrylate, tetrahydrofurfuryl acrylate, 3-methoxybutyl acrylate, 2-methyl-2-adamantyl acrylate, 2-propyl-2-adamantyl acrylate, 8-methyl-8-tricyclodecyl acrylate, 8-ethyl-8-tricyclodecyl acrylate, and 5-acryloyloxy-6-hydroxynorbornene-2-carboxylic-6-lactone.

Examples of the methacrylic acid ester compound include methyl methacrylate, ethyl methacrylate, isopropyl methacrylate, benzyl methacrylate, naphthyl methacrylate, anthryl methacrylate, anthrylmethyl methacrylate, phenyl methacrylate, 2-hydroxyethyl methacrylate, 2-hydroxypropyl methacrylate, 2,2,2-trifluoroethyl methacrylate, tert-butyl methacrylate, cyclohexyl methacrylate, isobornyl methacrylate, 2-methoxyethyl methacrylate, methoxytriethyleneglycol methacrylate, mono-(2-(methacryloyloxy)ethyl) phthalate, 2-ethoxyethyl methacrylate, tetrahydrofurfuryl methacrylate, 3-methoxybutyl methacrylate, 2-methyl-2-adamantyl methacrylate, 2-propyl-2-adamantyl methacrylate, 8-methyl-8-tricyclodecyl methacrylate, 8-ethyl-8-tricyclodecyl methacrylate, and 5-methacryloyloxy-6-hydroxynorbornane-2-carboxylic-6-lactone.

Examples of the vinyl compound include vinyl ether, methyl vinyl ether, benzyl vinyl ether, 2-hydroxyethyl vinyl ether, phenyl vinyl ether, and propyl vinyl ether.

Examples of the styrene compound include styrene, methylstyrene, chlorostyrene, and bromostyrene.

Examples of the maleimide compound include maleimide, N-methylmaleimide, N-phenylmaleimide, and N-cyclohexylmaleimide.

As the crosslinkable compound (B) used in the present invention, crosslinkable compounds of Formula (4) or Formula (5) can be used. The crosslinkable compound (B) is a compound having at least two vinyl ether groups and is preferably a compound having 2 to 20, for example 3 to 10, or 3 to 6 vinyl ether groups.

In Formula (4) and Formula (5), $Q^1$ is a (n2)-valent $C_{1-10}$ alkyl group, a (n2)-valent $C_{6-30}$ aryl group, or a (n2)-valent heterocycle group; $Q^2$ is a (n4)-valent $C_{1-10}$ alkyl group, a (n4)-valent $C_{6-30}$ aryl group, or a (n4)-valent heterocycle group; $R^5$ is a —O(CH$_2$)$_{n1}$— group or a —(OCH$_2$)$_{n1}$— group; $R^6$ is a single bond, an alkylene group, or an arylene group; and (n1) and (n3) are individually an integer of 1 to 10. (n2) and (n4) are individually an integer of 2 to 4.

Examples of the alkyl group include the above-exemplified alkyl groups. Examples of the $C_{6-30}$ aryl group include a phenyl group, an o-methylphenyl group, an m-methylphenyl group, a p-methylphenyl group, an o-chlorophenyl group, an m-chlorophenyl group, a p-chlorophenyl group, an o-fluorophenyl group, a p-fluorophenyl group, an o-methoxyphenyl group, a p-methoxyphenyl group, a p-nitrophenyl group, a p-cyanophenyl group, an α-naphthyl group, a β-naphthyl group, an o-biphenylyl group, an m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, and a 9-phenanthryl group.

These alkyl groups and aryl groups may also be substituted with a halogen atom (fluorine, chlorine, bromine, iodine), a nitro group, a cyano group, or the like.

Examples of the alkylene group and the arylene group include divalent organic groups corresponding to the above alkyl groups and aryl groups, respectively.

Examples of the heterocycle group include a pyridine ring, a pyrrole group, and a triazinetrione ring.

Examples of the crosslinkable compound of Formula (4) include bis(4-(vinyloxymethyl)cyclohexylmethyl)glutarate, tri(ethyleneglycol)divinyl ether, adipic acid divinyl ester, diethylene glycol divinyl ether, tris(4-(vinyloxy)butyltrimellitate, bis(4-(vinyloxy)butyl)terephthalate, bis(4-(vinyloxy)butyl)isophthalate, cyclohexanedimethanol divinyl ether, 1,4-butanediol divinyl ether, diethylene glycol divinyl ether, dipropylene glycol divinyl ether, trimethylolpropane trivinyl ether, and pentaerythritol tetravinyl ether.

Examples of the crosslinkable compound of Formula (4) include Formulae compounds of Formulae (4-1) to (4-6):

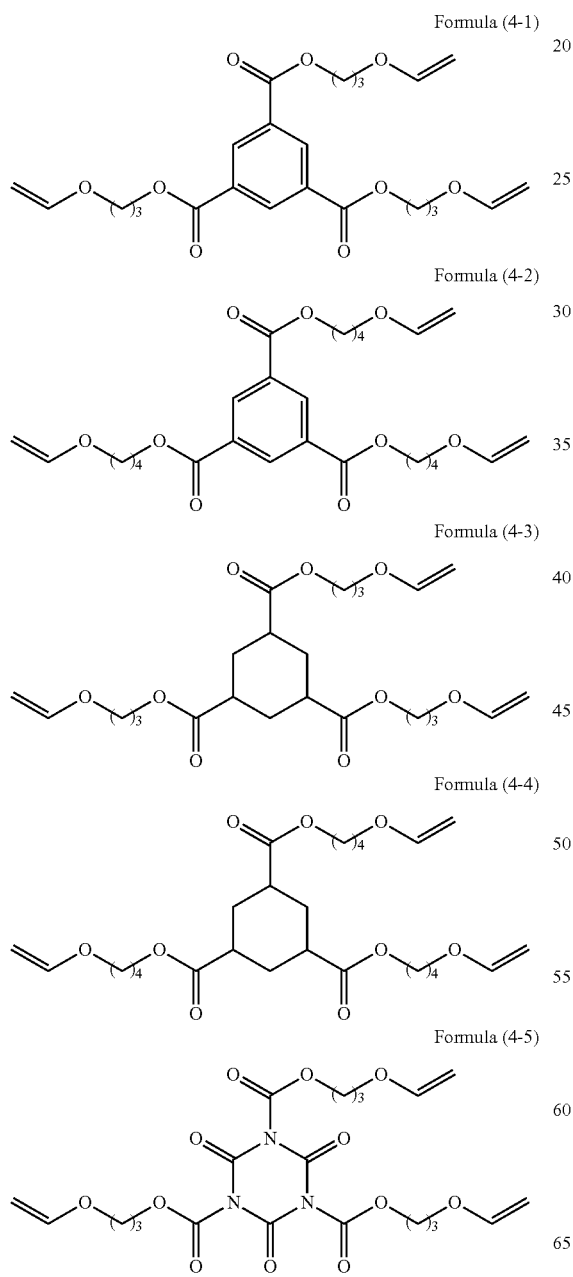

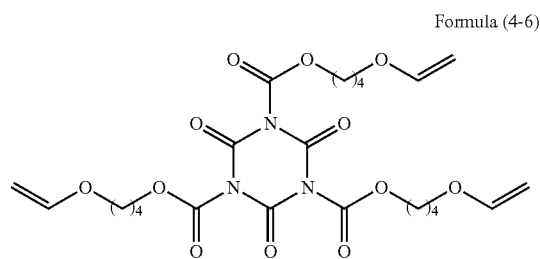

Examples of the crosslinkable compound of Formula (5) include compounds of Formulae (5-1) to (5-9):

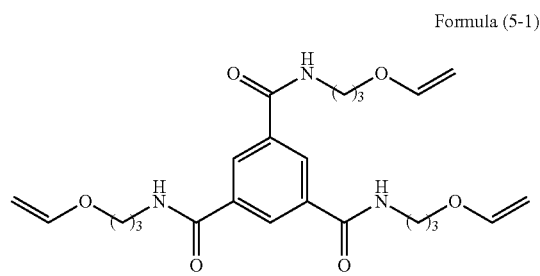

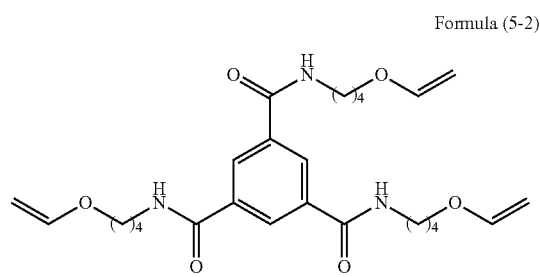

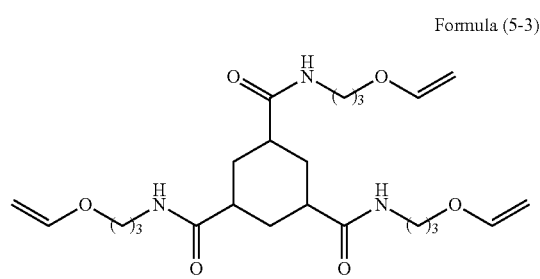

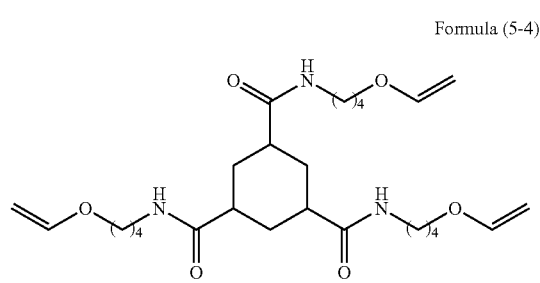

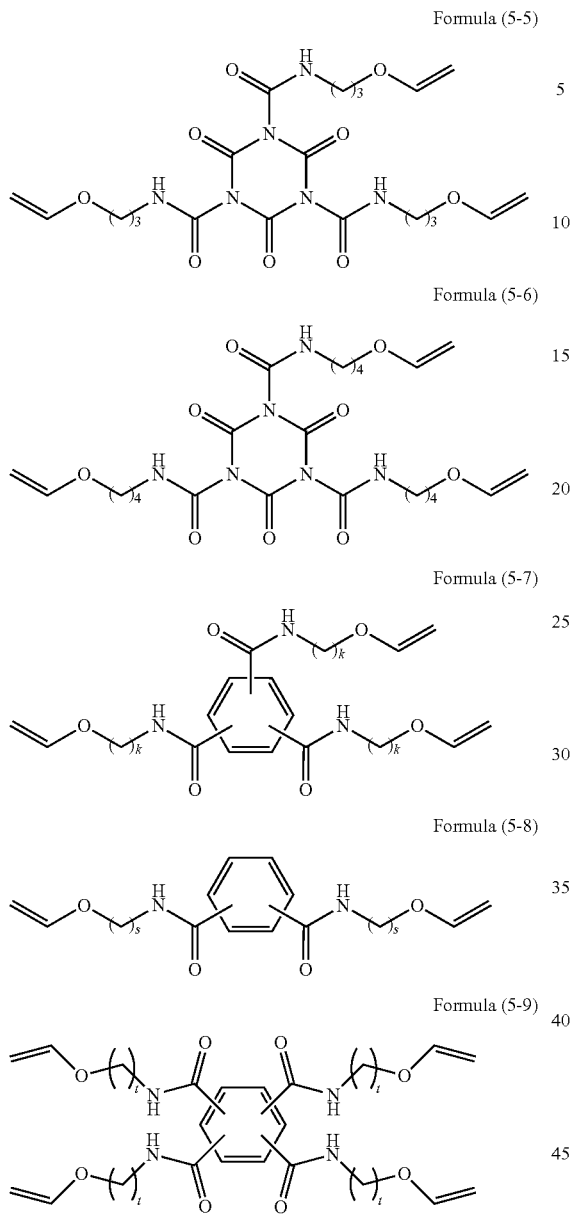

Examples of the above k, s, and t include 3 to 4.

In the fluoroalkylcarboxylic acid or a salt of the fluoroalkylcarboxylic acid (D) of Formula (6) used in the present invention, $R^7$ is a $C_{4-20}$ fluoroalkyl group or a $C_{4-20}$ perfluoroalkyl group and $Z^+$ is a proton, sulfonium, iodonium, ammonium, phosphonium, or stibonium.

Examples of the carboxylic acid anion containing $R^7$ in Formula (6) include anions of Formulae (6-1) to (6-6):

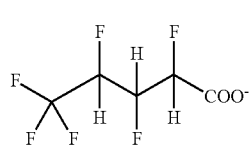

Examples of $Z^+$ in Formula (6) include cations of Formulae (7-1) to (7-11):

$H^+$      Formula (7-1)

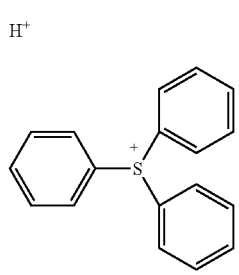

Formula (7-2)

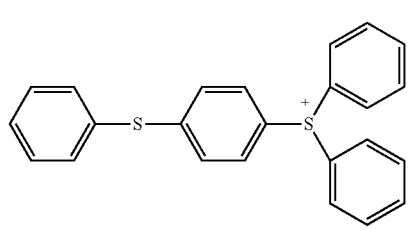

Formula (7-3)

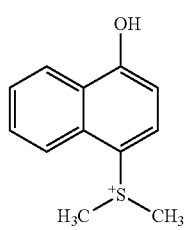

Formula (7-4)

-continued

Formula (7-5)
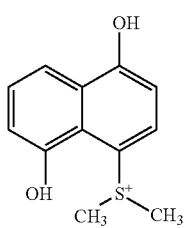

Formula (7-6)
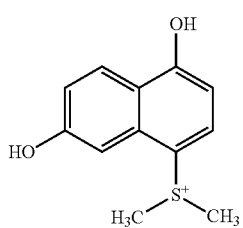

Formula (7-7)
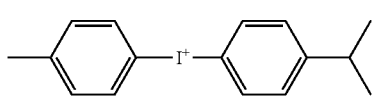

Formula (7-8)
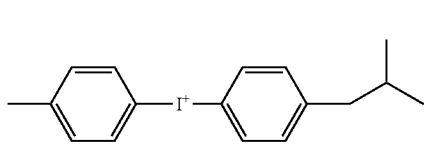

Formula (7-9)
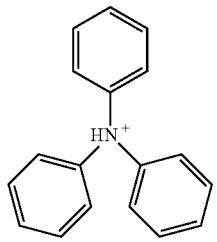

Formula (7-10)
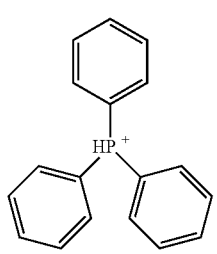

Formula (7-11)
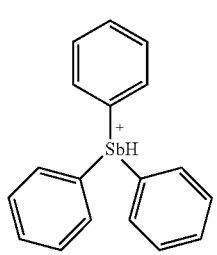

Examples of the photoacid generator (C) used in the present invention include compounds that generate an acid by being irradiated with light used for exposure. Examples of such compounds include diazomethane compounds, onium salt compounds, sulfonimide compounds, nitrobenzyl compounds, benzointosylate compounds, halogen-containing triazine compounds, and cyano group-containing oxime- sulfonate compounds. Among them, a photoacid generator of the onium salt compound is preferred.

Specific examples of the onium salt compounds include: triphenylsulfonium salt compounds such as triphenylsulfonium trifluorornethanesulfonate, triphenylsulfonium nonafluoro-n-butanesulfonate, triphenylsulfonium perfluoro-n-octanesulfonate, triphenylsulfonium-2-bicyclo[2.2.1]hepta-2-yl-1,1,2,2-tetrafluoroethanesulfonate, triphenylsulfonium-2-(3-tetracyclo[4.4.0.12,5. 17,10]dodecanyl)-1,1-difluoroethanesulfonate, triphenylsulfonium-N,N'-bis(nonafluoro-n-butanesulfonyl)imidate, and triphenylsulfonium camphorsulfonate; and diphenyliodonium salt compounds such as diphenyliodonium trifluoromethanesulfonate, diphenyliodonium nonafluoro-n-butanesulfonate, diphenyliodonium perfluoro-n-octanesulfonate, diphenyliodonium-2-bicyclo[2.2.1]hepta-2-yl-1,1,2,2-tetrafluoroethanesulfonate, diphenyliodonium-2-(3-tetracyclo[4.4.0,12,5. 17,10]dodecanyl)-1,1-difluoroethanesulfonate, diphenyliodonium-N,N'-bis(nonafluoro-n-butanesulfonyl)imidate, and diphenyliodonium camphorsulfonate.

The resist underlayer film forming composition according to the present invention may contain a basic compound (F). Examples of the basic compound include amines. By mixing a basic compound in the composition, the sensitivity of the resist underlayer film during the exposure can be controlled. In other words, a basic compound such as amines is reacted with an acid generated by a photoacid generator during the exposure and thus, can lower the sensitivity of the resist underlayer film. In addition, the basic compound can suppress the diffusion of the acid generated by the photoacid generator (C) in an exposed portion of the resist underlayer film into an unexposed portion of the resist underlayer film.

The amines are not particularly limited, and examples thereof include: tertiary amines such as triethanolamine, tributanolamine, trimethylamine, triethylamine, tri-n-propylamine, triisopropylamine, tri-n-butylamine, tri-tert-butylamine, tri-n-octylamine, triisopropanolamine, phenyldiethanolamine, stearyldiethanolamine, and diazabicyclooctane; and aromatic amines such as pyridine and 4-dimethylaminopyridine. Examples of the amines further include primary amines such as benzylamine and n-butylamine; and secondary amines such as diethylamine and n-butylamine.

The amines can suppress the diffusion of the acid generated by the photoacid generator (C) into an unexposed portion of the resist underlayer film. Meanwhile, the amines are incorporated into a crosslinked polymer formed by the polymer (A) and the crosslinkable compound (B) during the thermal crosslinking. The crosslinkage is broken by the acid generated by the photoacid generator (C) in an exposed portion to generate a hydroxy group, and thus, the exposed portion can exhibit solubility in a developer. Therefore, an amine having a hydroxy group is preferred. Examples of the amine having a hydroxy group include triethanolamine, tributanolamine, and diethanolmonophenylamine, which are preferably used.

The amines can be used individually or in combination of two or more types thereof. When an amine is used, as the content thereof; the basic compound such as amines may be mixed in the composition in an amount of 0.00005 mol to 0.5 mot, or 0.0005 mol to 0.05 mol, relative to 100 parts by mass of the polymer (A).

The resist underlayer film forming composition according to the present invention may contain a surfactant. Examples of the surfactant include: nonionic surfactants, for example polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monoleate, sorbitan trioleate, and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorinated surfactants, for example EFTOP EF301, EF303, and EF352 (trade name; manufactured by Gemco Co., Ltd. (former Tohkem Products Co., Ltd.)), MEGAFAC F171, F173, and R-30 (trade name; manufactured by DIC Corporation (former Dainippon Ink Chemical Industries Co., Ltd.)), Fluorad FC430 and FC431 (trade name; manufactured by Sumitomo 3M Limited), AsahiGuard AG710 and Surflon S-382, SC101, SC102, SC103, SC104, SC105, and SC106 (trade name; manufactured by Asahi Glass Co., Ltd.); and Organosiloxane polymer KP341 (manufactured by Shin-Etsu Chemical Co., Ltd.). The mix amount of the surfactant is usually 0.2% by mass or less, preferably 0.1% by mass or less, based on the total mass of all components of the resist underlayer film forming composition of the present invention. These surfactants may be mixed individually or in combination of two or more types thereof.

The resist underlayer film forming composition according to the present invention may further contain, if necessary, a rheology controlling agent, an adhesion assistant, and the like.

The resist underlayer film forming composition according to the present invention can be prepared by dissolving the above components in an appropriate solvent and is used in a homogeneous solution state. Examples of such a solvent include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, and N-methylpyrrolidone. These solvents may be used individually or in combination of two or more types thereof. Further, the solvent may be used in a mixture with a high boiling point-solvent such as propylene glycol monobutyl ether and propylene glycol monobutyl ether acetate.

The prepared resist underlayer film forming composition (solution) is preferably used after being filtered using a filter having a pore diameter of, for example around 0.2 μm. The thus prepared resist underlayer film forming composition is excellent also in long period storage stability at room temperature.

Hereinafter, the use of the resist underlayer film forming composition according to the present invention is described. The resist underlayer film forming composition according to the present invention is applied on a substrate (for example, semiconductor substrates such as silicon coated with a silicon oxide film, semiconductor substrates such as silicon coated with a silicon nitride film or a silicon oxide nitride film, silicon nitride substrates, quartz substrates, glass substrates (including alkali-free glass, low-alkali glass, crystallized glass), glass substrates on which an ITO film is formed, etc.) by an appropriate coating method such as spinner and coater. Then, through baking using heating means such as a hot plate, a resist underlayer film is formed. The baking conditions are accordingly selected from baking temperatures of 80° C. to 250° C. and baking times of 03 minutes to 60 minutes. Preferably, the baking temperature is 130° C. to 250° C. and the baking time is 0.5 minutes to 5 minutes. Here, the resist underlayer film has a film thickness of 0.005 μm to 3.0 μm, for example 0.01 μm to 1.0 μm, or 0.02 μm to 0.5 μm.

The resist underlayer film formed from the resist underlayer film forming composition according to the present invention becomes a rigid film by crosslinking a vinyl ether compound as the crosslinkable compound (B) through the baking during the formation of the resist underlayer film. Further, the resist underlayer film becomes a film having a low solubility in an organic solvent generally used in a photoresist solution applied on the resist underlayer film. Examples of such an organic solvent include ethylene glycol monomethyl ether, ethyl cellosolve acetate, diethylene glycol monoethyl ether, propylene glycol, propylene glycol monomethyl ether, propylene glycol monomethyl ether acetate, propylene glycol propyl ether acetate, toluene, methyl ethyl ketone, cyclohexanone, γ-butylolactone, ethyl 2-hydroxypropionate, ethyl 2-hydroxy-2-methylpropionate, ethyl ethoxyacetate, methyl pyruvate, ethyl lactate, and butyl lactate. Therefore, the resist underlayer film formed from the resist underlayer film forming composition according to the present invention becomes a resist underlayer film causing no intermixing with a photoresist. When the baking temperature is lower than the above range, the crosslinkage becomes unsatisfactory, which may cause an intermixing with a photoresist. On the contrary, when the baking temperature is too high, a crosslinkage is broken, which may also cause an intermixing with a photoresist.

Next, on the resist underlayer film, a photoresist film is formed. The formation of the photoresist film can be performed by a general method, that is, by applying a photoresist solution on the underlayer film and baking the photoresist solution.

The photoresist formed on the resist underlayer film of the present invention is not particularly limited so long as it is sensitive to exposure light and exhibits a positive-type behavior. Examples of the photoresist include: a positive-type photoresist containing a novolac resin and 1,2-naphthoquinonediazide sulfonic acid ester; a chemical amplification-type photoresist containing a binder having a group elevating the alkali dissolving rate by being decomposed by an acid, and a photoacid generator; a chemical amplification-type photoresist containing a low molecule compound elevating the alkali dissolving rate of a photoresist by being decomposed by an acid, an alkali-soluble binder, and a photoacid generator; and a chemical amplification-type photoresist containing a binder having a group elevating the alkali dissolving rate by being decomposed by an acid, a low molecule compound elevating the alkali dissolving rate of a photoresist by being decomposed by an acid, and a photoacid generator. Examples of the photoresist include trade name: PAR855 manufactured by Sumitomo Chemical Co., Ltd.

In the forming method of a photoresist pattern used in the production of a semiconductor device according to the present invention, the exposure is performed through a mask (reticle) for forming a predetermined pattern. For the exposure, a KrF excimer laser, an ArF excimer laser, and the like can be used. After the exposure, if necessary, post exposure bake is performed. The conditions for the post exposure bake is accordingly selected from baking temperatures of 80° C. to 150° C. and baking times of 0.3 minutes to 60 minutes.

A semiconductor device is produced by a process of exposing a semiconductor substrate coated with a resist underlayer film and a photoresist film to expose light using a photomask and developing a photoresist pattern thereafter. The resist underlayer film formed from the resist underlayer film forming composition according to the present invention becomes soluble in an alkaline developer by an action of an acid generated by a photoacid generator contained in the resist underlayer film during the exposure. After the exposure, when subjecting both the photoresist film and the resist underlayer film to a development at one time using an alkaline developer, the exposed portions of the photoresist film and the resist underlayer film exhibit alkali solubility, and therefore, are removed.

Examples of the alkaline developer include alkaline aqueous solutions such as; aqueous solutions of alkali metal hydroxides such as potassium hydroxide and sodium hydroxide; aqueous solutions of quaternary ammonium hydroxides such as tetramethylammonium hydroxide, tetraethylammonium hydroxide, and choline; and aqueous solutions of amines such as ethanolamine, propylamine, and ethylenediamine. Further, in these developers, a surfactant and the like may be also mixed.

The conditions for the development are accordingly selected from development temperatures of 5 to 50° C. and development times of 10 to 300 seconds. The resist underlayer film formed from the resist underlayer film forming composition of the present invention is developed by a developer used for general purpose of the development of the photoresist and can be easily developed at room temperature, for example using a 2.38% by mass tetramethylammonium hydroxide aqueous solution.

The resist underlayer film according to the present invention can be also used as: a layer for preventing an interaction between the substrate and the photoresist film; a layer having a function of preventing an adverse action of a material used in the photoresist film or a substance generated during the exposure of the photoresist against the semiconductor substrate; a layer having a function of preventing the diffusion of a substance generated in or on the semiconductor substrate during baking to the upper layer photoresist film; or a barrier layer for reducing a poisoning effect to the photoresist film by a semiconductor substrate dielectric layer.

Specific examples oldie resist underlayer film forming composition according to the present invention will now be described referring to the following Examples, which should not be construed as limiting the scope of the present invention.

EXAMPLE

Synthesis Example 1

20 g of N-(4-hydroxyphenyl)methacrylamide (manufactured by Tokyo Chemical Industry Co., Ltd.), 11.148 g of 4-vinylbenzoic acid (manufactured by Tokyo Chemical Industry Co., Ltd.), 17.327 g of 9-anthracenemethyl methacrylate (manufactured by Osaka Organic Chemical Industry Ltd.), and 4.8 g of 2,2'-azobis(isobutyric acid)dimethyl (manufactured by Wako Pure Chemical Industries, Ltd.) were dissolved in 124.4 g of methanol. The resultant reaction solution was dropped into 90 g of methanol warmed to 70° C. over 10 hours. Then, while maintaining the resultant reaction mixture at 70° C., the reaction was effected for 12 hours. The resultant reaction mixture was charged into ethyl acetate to precipitate a polymer. The obtained powder polymer was dried under reduced pressure to produce 42.5 g of a polymer of Formula (8-1):

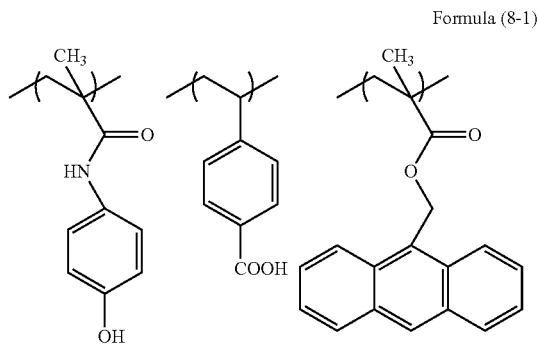

Formula (8-1)

The obtained polymer was subjected to a GPC analysis and as the result of the analysis, the polymer was found to have a weight average molecular weight of about 12,000 in terms of polystyrene.

Synthesis Example 2

20 g of 4-acetoxystyrene (manufactured by Tosoh Corporation), 4.55 g of methacrylic acid, and 2.46 g of 2,2'-azobis (isobutyric acid)dimethyl (manufactured by Wako Pure Chemical Industries, Ltd.) were dissolved in 63 g of tetrahydrofuran. The resultant reaction solution was dropped into 45 g of tetrahydrofuran warmed to 70° C. over, 10 hours. Then, while maintaining the resultant reaction mixture at 70° C., the reaction was effected for 12 hours. The resultant reaction mixture was charged into hexane to precipitate a polymer. Next, 10 g of the obtained polymer and 3 g of triethylamine were dissolved in 3 g of water, 30 g of methanol, and 30 g of tetrahydrofuran, and the resultant reaction solution was heated to reflux for 14 hours, followed by returning the reaction solution to room temperature to concentrate the reaction solution. Then, the resultant reaction mixture was re-dissolved in 30 g of acetone, to which 3 g of acetic acid was added. Next, the resultant reaction solution was stirred at room temperature for 30 minutes and then the reaction solution was charged into water to produce 9.9 g of a polymer of Formula (8-2):

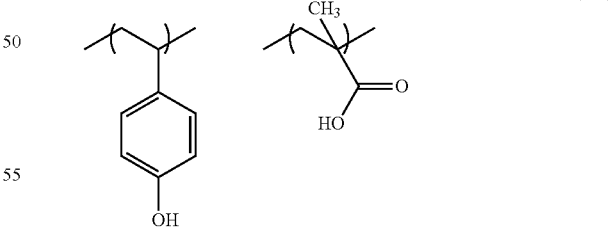

Formula (8-2)

The obtained polymer was subjected to a GPC analysis, and as the result of the analysis, the polymer was found to have a weight average molecular weight of about 10,900 in terms of polystyrene.

Example 1

0.1 g of the polymer obtained in Synthesis Example 1 as (A) was mixed with 0.04 g of 1,3,5-tris(4-vinyloxybutyl)

trimellitate (Formula (4-2)) as (B), 0.0058 g of triphenylsulfonium triflate (manufactured by Midori Kagaku. Co., Ltd.; trade name: TPS-105; Formula (8-3) below) as (C), 0.0038 g of N-lauryldiethanolamine (manufactured by Tokyo Chemical Industry Co., Ltd.) as (F), and 0.0098 g of triphenylsulfonium pentadecafluorooctanoate (manufactured by Wako Pure Chemical Industries, Ltd.; trade name: WPAG-422; Formula (8-4) below) as (1)), and the resultant mixture was dissolved in 8.9 g of propylene glycol monomethyl ether as (E). Subsequently, the resultant solution was filtered using a polyethylene microfilter having a pore diameter of 0.10 μm, and further filtered using a polyethylene microfilter having a pore diameter of 0.05 μm to prepare a photosensitive resist underlayer film forming composition (solution).

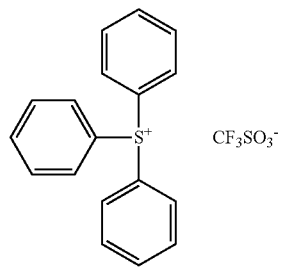

Formula (8-3)

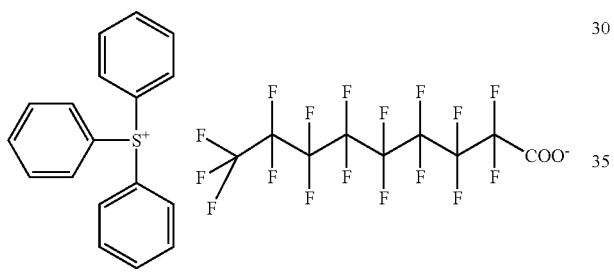

Formula (8-4)

Example 2

0.1 g of the polymer obtained in Synthesis Example 1 as (A) was mixed with 0.04 g of 1,3,5-tris(4-vinyloxybutyl) trimellitate (Formula (4-2)) as (B), 0.0058 g of triphenylsulfonium triflate (manufactured by Midori Kagaku Co., Ltd.; trade name: TPS-105; Formula (8-3)) as (C), 0.0038 g of N-lauryldiethanolamine (manufactured by Tokyo Chemical Industry Co., Ltd.) as (F), and 0.0049 g of triphenylsulfonium pentadecafluorooctanoate (manufactured by Wako Pure Chemical Industries, Ltd.; trade name: WPAG-422; Formula (8-4)) as (D), and the resultant mixture was dissolved in 8.9 g of propylene glycol monomethyl ether as (E). Subsequently, the resultant solution was filtered using a polyethylene microfilter having a pore diameter of 0.10 μm, and further filtered using a polyethylene microfilter having a pore diameter of 0.05 μm to prepare a photosensitive resist underlayer film forming composition (solution).

Example 3

0.1 g of the polymer obtained in Synthesis Example 1 as (A) was mixed with 0.04 g of 1,3,5-tris(4-vinyloxybutyl) trimellitate (Formula (4-2)) as (B), 0.0058 g of triphenylsulfonium triflate (manufactured by Midori Kagaku. Co., Ltd.; trade name: TPS-105; Formula (8-3)) as (C), 0.0038 g of N-lauryldiethanolamine (manufactured by Tokyo Chemical Industry Co., Ltd.) as (F), and 0.0025 g of triphenylsulfonium pentadecafluorooctanoate (manufactured by Wako Pure Chemical Industries, Ltd.; trade name; WPAG-422; Formula (8-4)) as (D), and the resultant mixture was dissolved in 8.9 g of propylene glycol monomethyl ether as (E). Subsequently, the resultant solution was filtered using a polyethylene microfilter having a pore diameter of 0.10 μm, and further filtered using a polyethylene microfilter having a pore diameter of 0.05 μm to prepare a photosensitive resist underlayer film forming composition (solution).

Example 4

0.1 g of the polymer obtained in Synthesis Example 1 as (A) was mixed with 0.04 g of 1,3,5-tris(4-vinyloxybutyl) trimellitate (Formula (4-2)) as (B), 0.0058 g of triphenylsulfonium triflate (manufactured by Midori Kagaku Co., Ltd.; trade name; TPS-105; Formula (8-3)) as (C), 0.0028 g of N-lauryldiethanolamine (manufactured by Tokyo. Chemical Industry Co., Ltd.) as (F), and 0.0036 g of triphenylsulfonium tricosafluorododecanoate (manufactured by Wako Pure Chemical Industries, Ltd.; trade name: WAG-437; Formula (8-5) below) as (D), and the resultant mixture was dissolved in 8.9 g of propylene glycol monomethyl ether as (E). Subsequently, the resultant solution was filtered using a polyethylene microfilter having a pore diameter of 0.10 μm, and further filtered using a polyethylene microfilter having a pore diameter of 0.05 μm to prepare a photosensitive resist underlayer film forming composition (solution).

Formula (8-5)

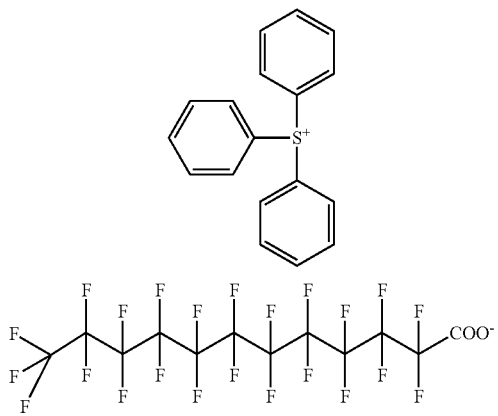

Example 5

0.1 g of the polymer obtained in Synthesis Example 2 as (A) was mixed with 0.05 g of 1,3,5-tris(4-vinyloxybutyl) trimellitate (Formula (4-2)) as (B), 0.0033 g of triphenylsulfonium-4-methylbenzenesulfonate (manufactured by Wako Pure Chemical Industries, Ltd.; trade name: WPAG-805; Formula (8-6) below) as (C), 0.0037 g of triphenylsulfonium camphorsulfonate (manufactured by Wako Pure Chemical Industries, Ltd.; trade name: WPAG-567; Formula (8-7) below) as (C), 0.0002 g of triethanolamine (manufactured by Tokyo Chemical Industry Co., Ltd.) as (F), and 0.005 g of triphenylsulfonium pentadecafluorooctanoate (manufactured by Wako Pure Chemical Industries, Ltd.; trade name: WPAG-422; Formula (8-4)) as (D), and the resultant mixture was dissolved in 28.5 g of propylene glycol monomethyl ether as (E). Subsequently, the resultant solution was filtered using a polyethylene microfilter having a pore diameter of 0.10 µm, and further filtered using a polyethylene microfilter having a pore diameter of 0.05 µm to prepare a photosensitive resist underlayer film forming composition (solution).

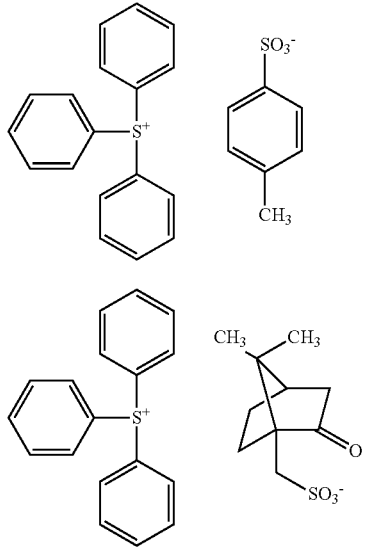

Formula (8-6)

Formula (8-7)

Example 6

0.1 g of polyhydroxystyrene (manufactured by Nippon Soda Co., Ltd.; trade name: VP-8000) as (A) was mixed with 0.05 g of 1,3,5-tris(4-vinyloxybutyl)trimellitate (Formula (4-2)) as (B), 0.0037 g of triphenylsulfonium camphorsulfonate (manufactured by Wake Pure Chemical Industries, Ltd.; trade name; WPAG-567; Formula (8-7)) as (C), 0.0001 g of triethanolamine (manufactured by Tokyo Chemical Industry Co., Ltd.) as (F), and 0.0025 g of triphenylsulfonium pentadecafluorooctanoate (manufactured by Wake Pure Chemical Industries, Ltd.; trade name: WPAG-422; Formula (8-4)) as (D), and the resultant mixture was dissolved in 27.5 g of propylene glycol monomethyl ether as (E). Subsequently, the resultant solution was filtered using a polyethylene microfilter having a pore diameter of 0.10 µm, and further filtered using a polyethylene microfilter having a pore diameter of 0.05 µm to prepare a photosensitive resist underlayer film forming composition (solution).

Comparative Example 1

0.1 g of the polymer obtained in Synthesis Example 1 as (A) was mixed with 0.04 g of 1,3,5-tris(4-vinyloxybutyl)trimellitate (Formula (4-2)) as (B), 0.0058 g of triphenylsulfonium triflate (manufactured by Midori Kagaku Co., Ltd.; trade name: TPS-105; Formula (8-3)) as (C), and 0.0038 g of N-lauryldiethanolamine (manufactured by Tokyo Chemical Industry Co., Ltd.) as (F), and the resultant mixture was dissolved in 8.9 g of propylene glycol monomethyl ether as (E). That is, there was prepared a solution in which triphenylsulfonium pentadecafluorooctanoate or triphenylsulfonium tricosafluorododecanoate as (I)) was removed from the composition of Example 1, 2, 3, or 4. Subsequently, the resultant solution was filtered using a polyethylene microfilter having a pore diameter of 0.10 µm, and further filtered using a polyethylene microfilter having a pore diameter of 0.05 µm to prepare a photosensitive resist underlayer film forming composition (solution).

Comparative Example 2

0.1 g of the polymer obtained in Synthesis Example 2 as (A) was mixed with 0.05 g of 1,3,5-tris(4-vinyloxybutyl)trimellitate (Formula (4-2)) as (B), 0.0033 g of triphenylsulfonium-4-methylbenzenesulfonate (manufactured by Wako Pure Chemical Industries, Ltd.; trade name: WAG-805; Formula (8-6)) as (C), 0.0037 g of triphenylsulfonium camphorsulfonate (manufactured by Wako Pure Chemical Industries, Ltd.; trade name: WPAG-567; Formula (8-7)) as (C), and 0.0002 g of triethanolamine (manufactured by Tokyo Chemical Industry Co., Ltd.) as (F), and the resultant mixture was dissolved in 28.1 g of propylene glycol monomethyl ether as (E). That is, there was prepared a solution in which triphenylsulfonium pentadecafluorooctanoate was removed from the composition of Example 5. Subsequently, the resultant solution was filtered using a polyethylene microfilter having a pore diameter of 0.10 µm, and further filtered using a polyethylene microfilter having a pore diameter of 0.05 µm to prepare a photosensitive resist underlayer film forming composition (solution).

Comparative Example 3

0.1 g of polyhydroxystyrene (manufactured by Nippon Soda Co., Ltd.; trade name. VP-8000) as (A) was mixed with 0.05 g of 1,3,5-tris(4-vinyloxybutyl)trimellitate (Formula (4-2)) as (B), 0.0037 g of triphenylsulfonium camphorsulfonate (manufactured by Wake Pure Chemical Industries, Ltd.; trade name: WPAG-567; Formula (8-7)) as (C), and 0.0001 g of triethanolamine (manufactured by Tokyo Chemical Industry Co., Ltd.) as (F), and the resultant mixture was dissolved in 27.2 g of propylene glycol monomethyl ether as (E), That is, there was prepared a solution in which triphenylsulfonium pentadecafluorooctanoate as (I)) was removed from the composition of Example 6. Subsequently, the resultant solution was filtered using a polyethylene microfilter having a pore diameter of 0.10 µm, and further filtered using a polyethylene microfilter having a pore diameter of 0.05 µm to prepare a photosensitive resist underlayer film forming composition (solution).

(Measurement of Focus Depth Margin 1)

Each of the resist underlayer film forming compositions (solutions) prepared in Examples 1 to 4 and Comparative Example 1 was applied on a semiconductor substrate (silicon wafer) using a spinner, and then, the composition was baked using a hot plate at 160° C. for 1 minute to form a resist underlayer film (film thickness: 0.05 µm). On the obtained resist underlayer film, a commercially available photoresist solution (manufactured by JSR Corporation; trade name: V1460) was applied using a spinner, and the solution was baked using a hot plate at 110° C. for 60 seconds to form a photoresist film (film thickness: 0.28 µm). Subsequently, by using a scanner (trade name: S-205C; manufactured by Nikon Corporation; wavelength: 248 nm, NA: 0.75, σ: 0.85 (⅔ annular illumination)), the exposure was performed through a mask set so that the photoresist pattern has a line width and a width between lines both of 0.15 µm after the development. Next, the resist pattern was subjected to a post exposure bake using a hot plate at 110° C. for 60 seconds, The resist pattern was cooled down and was developed using a 0.26 N tetramethylammonium hydroxide aqueous solution as a developer.

The above exposure was performed while the focus position was displaced upward and downward by 0.1 μm relative to the optimal focus position, and the development treatment was performed to form a resist pattern. When the specified lines of the photoresist pattern were formed, the photoresist pattern was evaluated as satisfactory. On the contrary, when the specified lines were not formed, the photoresist pattern was evaluated as not satisfactory. The displacement width between the uppermost and the lowermost focus positions that could attain the result of "satisfactory" was regarded as a focus depth margin. By using a resist underlayer film forming composition having a wide focus depth margin width, the workability in a lithography process becomes advantageous.

After the development, the figure of each of the obtained photoresist patterns was observed under a scanning electron microscope (SEM). As the result of the observation, as shown in FIG. 1, when the resist underlayer film obtained in Example 1 was used, the exposure was possible in a range of +03 μm to −0.2 μm relative to the optimal exposure position, and thus the focus depth margin was 0.6 μm.

When the resist underlayer film obtained in Example 2 was used, the exposure was possible in a range of +0.3 μm to −0.2 μm relative to the optimal exposure position, and thus the focus depth margin was 0.6 μm.

When the resist underlayer film obtained in Example 3 was used the exposure was possible in a range of +0.2 μm to −0.2 μm relative to the optimal exposure position, and thus the focus depth margin was measured as 0.5 μm.

When the resist underlayer film obtained in Example 4 was used, the exposure was possible in a range of +0.1 μm to −0.2 μm relative to the optimal exposure position, and thus the focus depth margin was 0.4 μm.

When the resist underlayer film obtained in Comparative Example 1 was used, the exposure was possible in a range of +0.1 μm to −0.1 μm relative to the optimal exposure position, and thus the focus depth margin was 0.3 μm.

That is, it is indicated that depending on the addition and the added amount of the fluoroalkylcarboxylic acid salts described in Examples 1 to 3 and Example 4, the focus depth margin is enlarged.

(Measurement of Focus Depth Margin 2)

Same as described above, each of the photosensitive resist underlayer film forming compositions (solutions) prepared in Example 5 and Comparative Example 2 was applied on a semiconductor substrate (silicon wafer) using a spinner and then the composition was baked using a hot plate at 180° C. for 1 minute to form a resist underlayer film (film thickness: 0.02 μm). On the obtained resist underlayer film, a commercially available photoresist solution (manufactured by JSR Corporation; trade name: V146G) was applied using a spinner and the solution was baked using a hot plate at 110° C. for 60 seconds to form a photoresist film (film thickness: 0.28 μm). Subsequently, by using a scanner (trade name: S-205C; manufactured by Nikon Corporation; wavelength; 248 nm, NA: 0.75, σ: 0.85 (⅔ annular illumination)), the exposure was performed through a mask set so that the photoresist pattern has a line width and a width between lines both of 0.25 μm after the development. Next, the resist pattern was subjected to a post exposure bake using a hot plate at 110° C. for 60 seconds. The resist pattern was cooled down and then was developed using a 0.26 N tetramethylammonium hydroxide aqueous solution as a developer.

In substantially the same manner as described above, the focus depth margin was measured.

Figure 2:
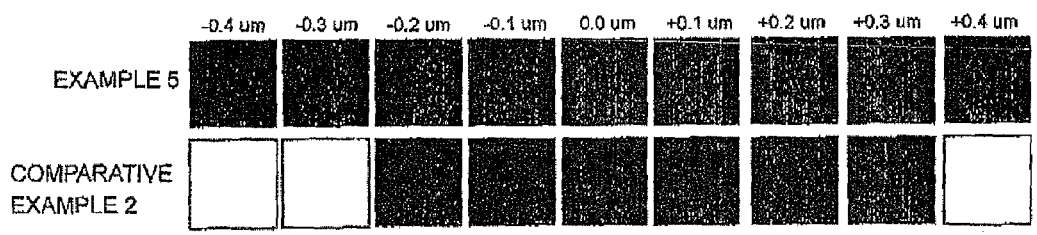
FIG. 2 is a scanning electron microscope photograph of a resist pattern shape for measuring a focus depth margin of the resist underlayer film obtained using each of the resist underlayer film forming compositions of Example 5 and Comparative Example 2 with a magnification of 20,000 times.

After the development, the figure of each of the obtained photoresist patterns was observed under a scanning electron microscope (SEM). As the result of the observation, as shown in FIG. 2, when the resist underlayer film obtained in Example 5 was used, the exposure was possible in a range of +0.3 μm to −0.3 μm relative to the optimal exposure position, and thus the focus depth margin was 0.7 μm.

When the resist underlayer film obtained in Comparative Example 2 was used, the exposure was possible in a range of +0.2 μm to −0.1 μm relative to the optimal exposure position, and thus the focus depth margin was 0.4 μm. In Comparative Example 2, at +0.3 μm and −0.2 μm, partially, a pattern collapse was observed.

That is, it is indicated that by adding a fluoroalkylcarboxylic acid salt, the focus depth margin is enlarged.

(Measurement of Focus Depth Margin 3)

Same as described above, each of the photosensitive resist underlayer film forming compositions (solutions) prepared in Example 6 and Comparative Example 3 was applied on a semiconductor substrate (silicon wafer) using a spinner, and then the composition was baked using a hot plate at 180° C. for 1 minute to form a resist underlayer film (film thickness: 0.02 μm). On the obtained resist underlayer film, a commercially available photoresist solution (manufactured by JSR Corporation; trade name: V1460) was applied using a spinner and the solution was baked using a hot plate at 110° C. for 60 seconds to form a photoresist film (film thickness: 0.28 μm). Subsequently, by using a scanner (trade name: S-205C; manufactured by Nikon Corporation; wavelength; 248 nm, NA: 0.75, σ: 0.85 (⅔ annular illumination)), the exposure was performed through a mask set so that the photoresist pattern becomes an isolated line of 0.22 μm after the development. Next, the resist pattern was subjected to a post exposure bake using a hot plate at 110° C. for 60 seconds. The resist pattern was cooled down and then was developed using a 0.26 N tetramethylammonium hydroxide aqueous solution as a developer.

In substantially the same manner as described above, the focus depth margin was measured.

Figure 3:
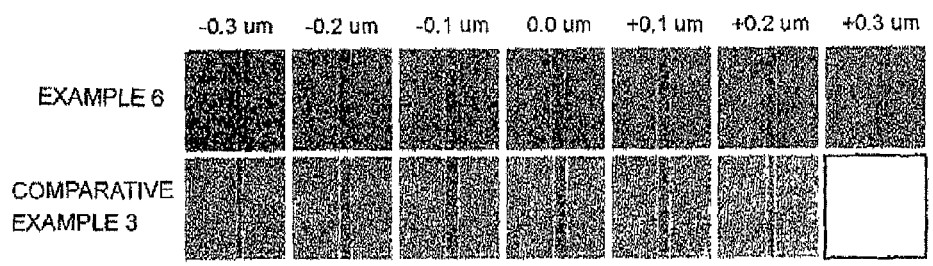
FIG. 3 is a scanning electron microscope photograph of a resist pattern shape for measuring a focus depth margin of the resist underlayer film obtained using each of the resist underlayer film forming compositions of Example 6 and Comparative Example 3 with a magnification of 50,000 tunes.

After the development, the figure of each of the obtained photoresist patterns was observed under a scanning electron microscope (SEM). As the result of the observation, as shown in FIG. 3, when the resist underlayer film obtained in Example 6 was used, the exposure was possible in a range of +0.2 μm to −0.2 pan relative to the optimal exposure position, and thus the focus depth margin was 0.5 μm.

When the resist underlayer film obtained in Comparative Example 3 was used, the exposure was possible in a range of +0.1 μm to −0.2 μm relative to the optimal exposure position, and thus the focus depth margin was 0.4 μm.

That is, it is indicated that by adding a fluoroalkylcarboxylic acid salt, the focus depth margin is enlarged.

What is claimed is:

1. A resist underlayer film forming composition used in a lithography process comprising:
   a polymer (A) containing a unit structure having a hydroxy group, a unit structure having a carboxy group, or combination thereof;
   a crosslinkable compound (B) having at least two vinyl ether groups;
   a photoacid generator (C);
   a $C_{4-20}$ fluoroalkylcarboxylic acid or a salt of the fluoroalkylcarboxylic acid (D); and
   a solvent (E), wherein:
   the polymer (A) includes a unit structure selected from unit structures of Formula (1), Formula (2), and Formula (3):

Formula (1)

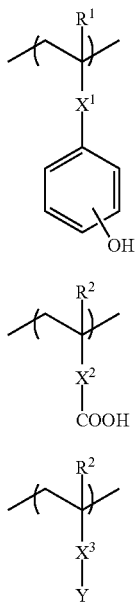

Formula (2)

Formula (3)

(where $R^1$, $R^2$, and $R^3$ are individually a hydrogen atom or a methyl group; $X^1$, $X^2$, and $X^3$ are individually a direct bond or a linking group; and Y is a light absorbing group), where when the total number of all unit structures constituting the polymer is assumed to be 1.0, the number a of unit structures of Formula (1), the number b of unit structures of Formula (2), and the number c of unit structures of Formula (3) satisfy equations:

$0 \le a \le 1.0$, $0 \le b \le 1.0$, $0 \le c \le 0.5$, and $0.5 \le a+b \le 1.0$, and has a weight average molecular weight of 3,000 to 100,000; and the $C_{4\text{-}20}$ fluoroalkylcarboxylic acid or a salt of the fluoroalkylcarboxylic acid (D) is a compound of Formula (6):

$R^7$—COO$^-$Z$^+$    Formula (6)

(where $R^7$ is a $C_{4\text{-}20}$ fluoroalkyl group or a $C_{4\text{-}20}$ perfluoroalkyl group; and $Z^+$ is a proton, sulfonium, iodonium, ammonium, phosphonium, or stibonium).

2. The resist underlayer film forming composition according to claim 1, wherein $X^1$ is a direct bond or —C(=O)NR$^4$— (where $R^4$ is a hydrogen atom or an alkyl group), $X^2$ is a direct bond or a phenyl group, and $X^3$ is a direct bond or an organic group having an ester group, an ether group, an alkyl group, or a combination thereof.

3. The resist underlayer film forming composition according to claim 1, wherein the crosslinkable compound (B) is a crosslinkable compound of Formula (4) or Formula (5):

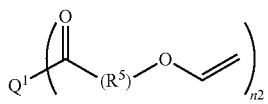

Formula (4)

Formula (5)

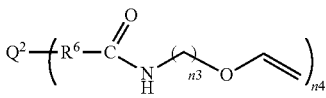

(where $Q^1$ is a (n2)-valent $C_{1\text{-}10}$ alkyl group, a (n2)-valent $C_{6\text{-}30}$ aryl group, or a (n2)-valent heterocycle group; $Q^2$ is a (n4)-valent $C_{1\text{-}10}$ alkyl group, a (n4)-valent $C_{6\text{-}30}$ aryl group, or a (n4)-valent heterocycle group; $R^5$ is a —O(CH$_2$)$_{n1}$— group or a —(OCH$_2$)$_{n1}$— group; $R^6$ is a direct bond, an alkylene group, or an arylene group; (n1) and (n3) are individually an integer of 1 to 10; and (n2) and (n4) are individually an integer of 2 to 4).

4. The resist underlayer film forming composition according to claim 1, further comprising a basic compound (F).

5. The resist underlayer film forming composition according to claim 1, wherein polymer (A) includes unit structures of each Formula (1), Formula (2), and Formula (3).

6. The resist underlayer film forming composition according to claim 5, wherein an underlayer film formed from the underlayer film forming composition is photosensitive.

7. The resist underlayer film forming composition according to claim 5, wherein the compound of Formula (8) comprises pentadecafluorooctanoate as $R^7$—COO$^-$.

8. The resist underlayer film forming composition according to claim 5, wherein the compound of Formula (6) comprises tricosafluorododecanoate as $R^7$—COO$^-$.

9. A forming method of a photoresist pattern used in the production of a semiconductor device, the forming method comprising:

applying the resist underlayer film forming composition as claimed in claim 1 on a semiconductor substrate and baking the composition to form a resist underlayer film;

forming a photoresist film on the resist underlayer film;

exposing the semiconductor substrate coated with the resist underlayer film and the photoresist film to light; and developing the photoresist film and the resist underlayer film after the exposure.

10. A forming method of a photoresist pattern used in the production of a semiconductor device, the forming method comprising:

applying the resist underlayer film forming composition as claimed in claim 2 on a semiconductor substrate and baking the composition to form a resist underlayer film;

forming a photoresist film on the resist underlayer film;

exposing the semiconductor substrate coated with the resist underlayer film and the photoresist film to light; and developing the photoresist film and the resist underlayer film after the exposure.

11. A forming method of a photoresist pattern used in the production of a semiconductor device, the forming method comprising:

applying the resist underlayer film forming composition as claimed in claim 3 on a semiconductor substrate and baking the composition to form a resist underlayer film;

forming a photoresist film on the resist underlayer film;

exposing the semiconductor substrate coated with the resist underlayer film and the photoresist film to light; and developing the photoresist film and the resist underlayer film after the exposure.

12. A forming method of a photoresist pattern used in the production of a semiconductor device, the forming method comprising:

applying the resist underlayer film forming composition as claimed in claim 4 on a semiconductor substrate and baking the composition to form a resist underlayer film;

forming a photoresist film on the resist underlayer film;

exposing the semiconductor substrate coated with the resist underlayer film and the photoresist film to light; and developing the photoresist film and the resist underlayer film after the exposure.

* * * * *